United States Patent
Berger et al.

(10) Patent No.: US 12,243,895 B2
(45) Date of Patent: Mar. 4, 2025

(54) PIXEL OF A LIGHT SENSOR AND METHOD FOR MANUFACTURING SAME

(71) Applicant: STMICROELECTRONICS (CROLLES 2) SAS, Crolles (FR)

(72) Inventors: Thierry Berger, Brignoud (FR); Marc Neyens, Grenoble (FR); Audrey Vandelle Berthoud, Grenoble (FR); Marc Guillermet, Grenoble (FR); Philippe Brun, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 482 days.

(21) Appl. No.: 17/211,739

(22) Filed: Mar. 24, 2021

(65) Prior Publication Data
US 2021/0305306 A1 Sep. 30, 2021

(30) Foreign Application Priority Data

Mar. 31, 2020 (FR) ...................... 2003174

(51) Int. Cl.
*H01L 27/146* (2006.01)
(52) U.S. Cl.
CPC .. *H01L 27/14636* (2013.01); *H01L 27/14603* (2013.01); *H01L 27/14643* (2013.01); *H01L 27/14689* (2013.01)
(58) Field of Classification Search
CPC ......... H01L 27/14636; H01L 27/14603; H01L 27/14643; H01L 27/14689; H01L 31/0224;
(Continued)

(56) References Cited

U.S. PATENT DOCUMENTS

2003/0062826 A1 4/2003 Seo et al.
2005/0224707 A1* 10/2005 Guedj ............... H01L 27/14665
257/E27.141
(Continued)

FOREIGN PATENT DOCUMENTS

CN 103296037 A 9/2013
CN 104576663 A 4/2015
CN 105914216 B 1/2019

OTHER PUBLICATIONS

Kramer et al., "Efficient Spray-Coated Colloidal Quantum Dot Solar Cells," *Adv. Mater.*, 27(1):116-121, Jan. 2015.
(Continued)

*Primary Examiner* — William B Partridge
*Assistant Examiner* — David Paul Sedorook
(74) *Attorney, Agent, or Firm* — Seed IP Law Group LLP

(57) ABSTRACT

The present disclosure relates to a method for manufacturing a pixel by: depositing an insulating layer on an exposed face of an interconnect structure of an integrated circuit, the interconnect structure having a conductive element flush with said exposed face; etching an opening passing through the insulating layer to the conductive element; depositing an electrode layer on and in contact with the conductive element and the insulating layer; defining an electrode by removing, by etching, part of the electrode layer resting on the insulating layer; and depositing a film configured to convert photons into electron-hole pairs when a ray at an operating wavelength of the pixel reaches the pixel.

20 Claims, 3 Drawing Sheets

(58) Field of Classification Search
CPC ......... H01L 27/14638; H01L 27/14669; H01L 31/09; H01L 27/1461
See application file for complete search history.

(56) References Cited

U.S. PATENT DOCUMENTS

| | | |
|---|---|---|
| 2008/0237481 A1 | 10/2008 | Zentai et al. |
| 2012/0168759 A1 | 7/2012 | Lee |
| 2013/0020663 A1* | 1/2013 | Takimoto .......... H01L 27/14645 257/431 |
| 2016/0035921 A1* | 2/2016 | Matsuda .......... H01L 27/14694 257/14 |
| 2017/0186788 A1* | 6/2017 | Yen .................... H01L 27/14636 |
| 2017/0186819 A1* | 6/2017 | Yun ...................... H10K 50/844 |
| 2017/0194376 A1* | 7/2017 | Kim .................... H01L 31/0224 |
| 2018/0053788 A1* | 2/2018 | Lee ...................... H01L 27/124 |
| 2019/0157362 A1* | 5/2019 | Rho .................... H10K 50/822 |
| 2019/0319055 A1* | 10/2019 | Zaizen .............. H01L 31/03046 |
| 2021/0104564 A1 | 4/2021 | Kawai et al. |
| 2021/0217793 A1* | 7/2021 | Maruyama ............. H04N 25/63 |
| 2021/0305309 A1 | 9/2021 | Berger et al. |
| 2022/0085110 A1* | 3/2022 | Shigetoshi ........ H01L 27/14687 |

OTHER PUBLICATIONS

Palomaki et al., "Snapshots by quantum dots: Look out, CMOS image sensors. There's a new kid in camera-town," *IEEE Spectrum*, IEEE Inc., New York, NY, vol. 57, No. 3:24-29, Mar. 2020.
U.S. Appl. No. 17/211,723, filed Mar. 24, 2021.

* cited by examiner

PIXEL OF A LIGHT SENSOR AND METHOD FOR MANUFACTURING SAME

BACKGROUND

Technical Field

The present disclosure relates generally to light sensors, for example image sensors, and more particularly a pixel of a light sensor and a method for manufacturing such a pixel.

Description of the Related Art

Light sensors are known comprising an integrated circuit made from CMOS (Complementary Metal Oxide Semiconductor) technology, an interconnect structure resting on the integrated circuit, and a photosensitive film resting on the interconnect structure. The photosensitive film is part of a stack arranged above the integrated circuit (ABove Integrated Circuit), that is to say a stack of the ABIC type. The film is configured to implement, at the operating wavelength of the sensor, the conversion of incident photons into electron-hole pairs. In such sensors, each pixel of the sensor generally comprises a portion of the photosensitive film.

BRIEF SUMMARY

There is a need to address all or some of the drawbacks of the known light sensors, in particular known light sensors of the type described above.

One embodiment addresses all or some of the drawbacks of the known light sensors, in particular known light sensors of the type described above.

One embodiment provides a method for manufacturing a pixel comprising the following successive steps:
- depositing an insulating layer on an exposed face of an interconnect structure of an integrated circuit, the interconnect structure having a conductive element flush with said exposed face;
- etching an opening passing through the insulating layer to the conductive element;
- depositing an electrode layer on and in contact with the conductive element and the insulating layer;
- defining an electrode by removing, by etching, part of the electrode layer resting on the insulating layer; and
- depositing a film configured to convert photons into electron-hole pairs when a ray at an operating wavelength of the pixel reaches the pixel.

According to one embodiment, the film comprises colloidal quantum dots.

According to one embodiment, a part of the conductive element exposed by etching of the opening and the side walls of the opening are completely covered by the electrode, the electrode overflowing onto the insulating layer around the opening.

According to one embodiment, the thickness of the insulating layer is equal to half of said wavelength in the material of the film.

According to one embodiment, said wavelength of the ray is inclusively between 750 nm and 3000 nm, for example equal to 940 nm.

According to one embodiment, the film is deposited such that an exposed face of the film is planar.

According to one embodiment, the deposition of the electrode layer comprises depositing at least one layer of a conductive material.

According to one embodiment, the deposition of the electrode layer comprises depositing a layer of tantalum and/or depositing a layer of titanium nitride and/or depositing a layer of tantalum nitride.

According to one embodiment, the method further comprises a following step for forming another electrode on said film.

According to one embodiment, the other electrode is made from one or several materials transparent to said wavelength.

According to one embodiment, the deposition of the insulating layer comprises depositing at least one layer of an insulating material.

According to one embodiment, the deposition of the insulating layer comprises depositing a diffusion barrier layer on and in contact with said exposed face of the interconnect structure.

According to one embodiment, the electrode layer is thinner, for example ten times thinner, than the insulating layer and/or the film is thicker, for example at least two times thicker, than the insulating layer.

Another embodiment provides a pixel comprising:
- an insulating layer resting on and in contact with a face of an interconnect structure of an integrated circuit of the pixel, the interconnect structure having a conductive element flush with said face;
- an opening passing through the insulating layer to the conductive element;
- an electrode resting on and in contact with the conductive element; and
- a film configured to convert photons into electron-hole pairs when a ray at an operating wavelength of the pixel reaches the pixel, said film filling the opening and covering the electrode and the insulating layer.

According to one embodiment, the pixel is obtained by implementing the described method.

According to one embodiment, said film comprises colloidal quantum dots.

According to one embodiment, the electrode is thinner, for example ten times thinner, than the insulating layer and/or the film is thicker, for example at least two times thicker, than the insulating layer.

According to one embodiment:
- the thickness of the film is inclusively between 200 nm and 1 µm, for example equal to about 500 nm; and/or
- the thickness of the electrode is inclusively between 5 and 100 nm; and/or
- the thickness of the insulating layer is inclusively between 50 nm and 500 nm, for example between 50 nm and 300 nm, for example equal to 200 nm.

According to one embodiment, the pixel comprises another electrode resting on the film, said other electrode being made from a material transparent to the wavelength of the ray.

Another embodiment provides a light sensor comprising at least one pixel as described.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail. In particular, the usual CMOS integrated circuits of light sensors, in particular the CMOS integrated circuits for reading pixels, have not been described in detail, the described embodiments, modes of implementation and variants being compatible with the usual CMOS integrated circuits of light sensors.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the remainder of the disclosure, an operating wavelength of a light sensor or of a pixel of a light sensor refers to a wavelength of a ray of light, or electromagnetic ray, received by the sensor or the pixel for which the sensor or the pixel implements a conversion of the received photons into electron-hole pairs. A light sensor or a pixel of such a sensor can have several operating wavelengths, for example within a range of operating wavelengths.

In the following disclosure, unless indicated otherwise, when reference is made to absolute positional qualifiers, such as the terms "front," "back," "top," "bottom," "left," "right," etc., or to relative positional qualifiers, such as the terms "above," "below," "higher," "lower," etc., or to qualifiers of orientation, such as "horizontal," "vertical," etc., reference is made to the orientation shown in the figures.

Unless specified otherwise, the expressions "around," "approximately," "substantially" and "in the order of" signify within 10%, and preferably within 5%.

Figure 1:
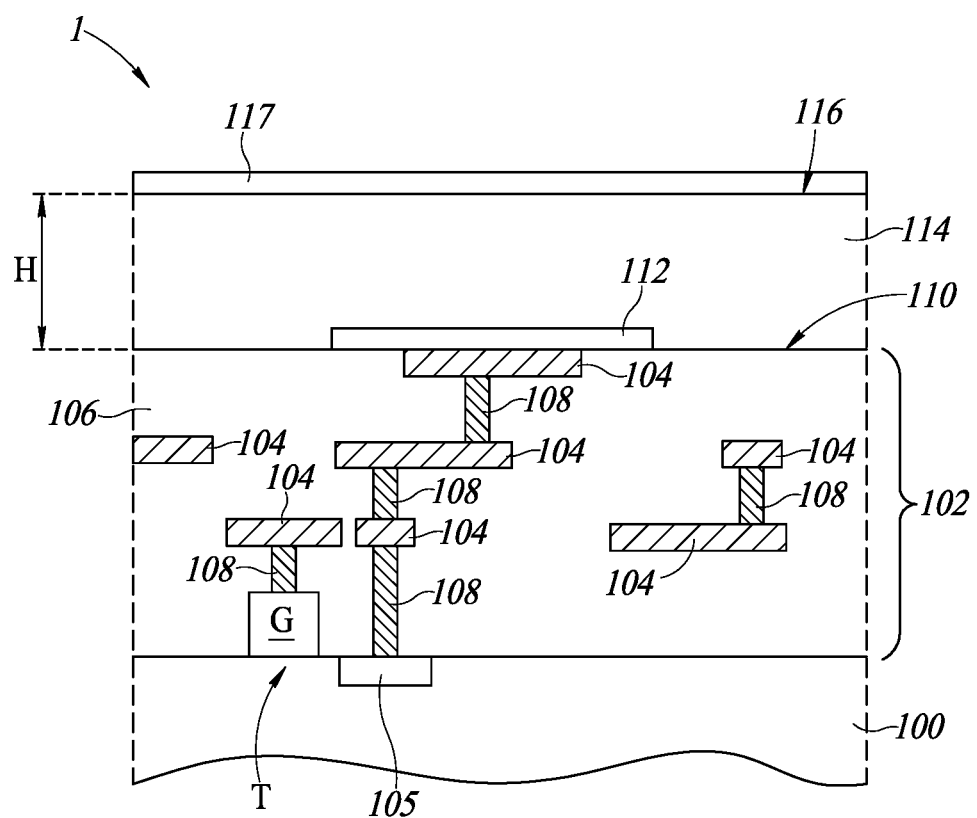
FIG. 1 shows, in partial schematic sectional view, one example of a pixel of a light sensor.

FIG. 1 shows, in partial schematic sectional view, one example of a pixel 1 of a light sensor, with the understanding that in practice, the sensor may have several identical pixels 1, for example several hundred or several thousand pixels 1.

The sensor comprises a semiconductor layer 100, for example a semiconductor substrate or a layer of a semiconductor on insulator (SOI) structure. The layer 100 is for example a layer of silicon.

Various components made from CMOS technology are formed in and/or on the layer 100. In other words, various CMOS components are formed from the layer 100. In FIG. 1, only one of these components is shown, in this example a transistor T whereof only the gate electrode G, also called gate stack or gate, is shown in FIG. 1.

The layer 100 and the CMOS components formed in and/or on this layer 100 form an integrated circuit using CMOS technology of the sensor, or CMOS integrated circuit. As an example, the CMOS integrated circuit comprises circuits for reading pixels of the sensor.

The sensor comprises an interconnect structure 102. The interconnect structure 102 covers the CMOS integrated circuit of the sensor, or in other words, covers the layer 100 and the CMOS components formed in and/or on this layer 100. The upper face or surface 110 of the interconnect structure 102 is planar.

The interconnect structure 102 comprises electrically conductive layer portions 104, for example metal layer portions, embedded in electrically insulating layers. In other words, these conductive layer portions 104 are separated from one another by these insulating layers. In FIG. 1, the insulating layers of the interconnect structure 102 are shown by a single insulating layer 106.

The interconnect structure 102 comprises electrically conductive vias 108, for example metal vias, electrically connecting the conductive layer portions 104 to one another and/or to CMOS components of the integrated circuit of the sensor.

The conductive vias 108 and the conductive layer portions 104 make up electrically conductive elements of the interconnect structure 102.

In addition to the interconnect structure 102 and the CMOS integrated circuit that it covers, the pixel 1 comprises an electrically conductive element 108 or 104 of the interconnect structure 102 that is flush with the upper face 110 of the interconnect structure 102, that is to say, with the upper face of the insulating layer 106.

Preferably, as shown in FIG. 1, this conductive element is a conductive layer portion 104. Preferably, this conductive element is electrically coupled to a read circuit of the pixel 1 comprising CMOS components such as the transistor T, by means of other conductive elements 104, 108 of the interconnect structure 100. For example, the conductive element 104 flush with the face 110 is electrically coupled to a doped zone or region 105 formed in the layer 100 and making up a storage area for photogenerated charges. Said differently, an upper surface of the conductive element 104 is coplanar with the surface 110.

The pixel 1 comprises an electrode 112. A central part of the electrode 112 rests on and in contact with the conductive element 104 flush with the face 110. The electrode 112 constitutes a lower, first electrode of the pixel 1. A lower surface of the electrode 112 is coplanar with the surface 110.

A photosensitive film 114 rests on the interconnect structure 102. The film 114 covers the interconnect structure 102 and the electrode 112 of the pixel 1. More specifically, the film 114 rests on and in contact with the entire electrode 112 and on and in contact with all of the portions of the face 110 not covered with the electrode 112.

The film 114 has a planar upper face or surface 116. Between the face 110 and the face 116, the film 114 has a thickness or dimension H.

The pixel 1 also comprises an upper, second electrode 117 resting on the face 116 of the film 114.

During operation, when the light at the operating wavelength of the sensor is received by the pixel 1, electron-hole pairs are photogenerated in the film 114. The photogenerated holes or electrons are next collected by the electrode 112 in order to be transmitted to the CMOS integrated reading circuit of the pixel 1. The reading circuit of the pixel then provides information representative of the quantity of light at the operating wavelength of the pixel 1 that is received by this pixel 1.

The quantum efficiency QE of the pixel 1 corresponds to the ratio between the number of photogenerated holes or electrons collected by the pixel 1 and the number of photons received by the pixel 1 at the operating wavelength of the pixel 1. In order to increase the quantum efficiency of the pixel 1, it would be desirable to increase the thickness H of the film 114.

However, increasing the thickness H of the film 114 raises various problems. Indeed, increasing the thickness of the film 114 causes an increase in the risk of delamination of the film 114 and/or an increase in the risk of cracks forming through all or part of the thickness of the film 114. Furthermore, an increase in the thickness of the film 114 causes an increase in the number of steps to form the film 114, for example because the film 114 is then formed by at least two successive depositions, resulting in an increase in the production cost of the pixel 1, and more generally of a light sensor comprising one or several pixels 1.

By locally increasing the thickness of the photosensitive film of a pixel of the type of the pixel 1, above the electrode 112, by keeping the upper face 116 planar of the film 114, and by keeping, beyond the electrode 112, a thickness of the film 114 for which the risk of delamination or cracking is nil or practically nil.

FIGS. 2 to 5 illustrate successive steps of one embodiment of a method for manufacturing a pixel of a light sensor, leading to obtaining a photosensitive film that is locally thicker above the lower electrode of the pixel. The pixel manufactured using this method comprises a CMOS integrated circuit similar or identical to that of the pixel 1, and an interconnect structure 102 similar or identical to that of the pixel 1, the interconnect structure 102 resting on the CMOS integrated circuit.

Figure 2:
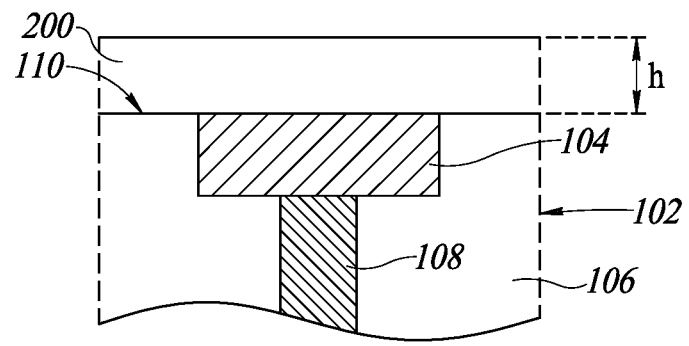
FIG. 2 illustrates, by schematic sectional view, one step of an embodiment of a method for manufacturing a pixel of an image sensor.

FIG. 2 is a schematic sectional or cross-sectional view illustrating a step of the manufacturing method.

In FIG. 2, only a portion of the interconnect structure 102 is shown. The illustrated portion of the interconnect structure 102 comprises an electrically conductive element 104 or 108 flush with the upper face 110 of the interconnect structure 102.

Preferably, as shown in FIG. 2, the conductive element flush with the face 110 is a conductive layer portion 104 of the interconnect structure 102. Preferably, the conductive element 104 is electrically coupled to the CMOS integrated circuit (not shown) on which the interconnect structure 102 rests, for example to a reading circuit of the pixel.

As an example, the conductive element 104 is made from a metal such as copper or aluminum, or from a metal alloy such as an aluminum/copper alloy.

In the step of FIG. 2, an insulating layer 200 has been deposited on and in contact with the face 110 of the interconnect structure 102, with the understanding that, before the deposition of the layer 200, the face 110 was an exposed face of the interconnect structure 102. Preferably, the layer 200 is deposited on and in contact with the entire face 110 of the interconnect structure, or in other words, is blanket-deposited.

According to one embodiment, the deposition of the layer 200 corresponds to the deposition of a single layer of an electrically insulating material. Preferably, this material is a diffusion barrier material for the metal, the layer 200 then making up a diffusion barrier layer. In other words, preferably, the layer 200 comprises a diffusion barrier layer on and in contact with the face 110.

According to another embodiment, the deposition of the layer 200 corresponds to successive deposits of layers each made from an electrically insulating material, optionally different between the layers. Preferably, the first layer deposited on and in contact with the face 110 of the interconnect structure 102 in order to form the layer 200 is made from a diffusion barrier material for the metal, the layer 200 then comprising a diffusion barrier layer on and in contact with the face 110 of the interconnect structure 102.

As an example, the layer 200 is made from silicon nitride (for example SiN or $Si_3N_4$) or corresponds to a stack of a layer of silicon nitride resting on and in contact with the face 110, and a layer of silicon oxide resting on and in contact with the layer of silicon nitride.

As an example, the thickness h of the layer 200 is inclusively between 50 nm and 500 nm, for example between 50 nm and 300 nm, for example equal to 200 nm.

Figure 3:
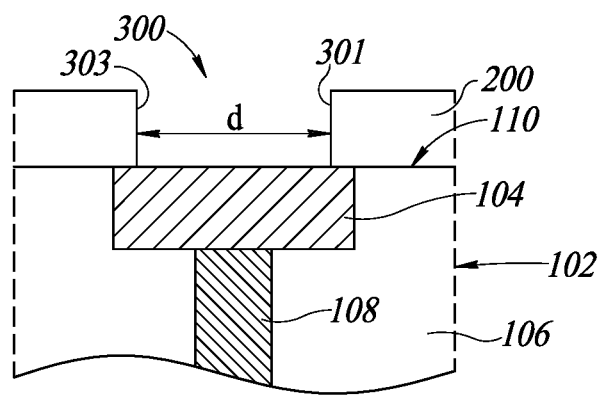
FIG. 3 illustrates, by schematic sectional view, another step of the method for manufacturing the pixel.

In the step of FIG. 3, an opening 300 is etched through the layer 200, to the conductive layer 104 flush with the face 110. In other words, the etching of the opening 300 is stopped on the face 110 of the interconnect structure 102. After the etching of the opening 300, at least part of the conductive element 104 is exposed at the bottom of the opening 300 (at the bottom of the opening 300 in FIG. 3) or, in other words, at the face 110.

According to one embodiment, the opening 300 is etched so as to emerge only on the conductive element 104 flush with the face 110. This element 104 can then advantageously serve as etching stop layer.

As an example, the opening 300 has lateral dimensions d, for example a diameter in the case where the opening 300 has a circular shape seen from above or a side in the case where the opening 300 has a square shape seen from above, that are smaller than or equal to one third of the lateral dimensions of the manufactured pixel. The lateral dimensions of the pixel and the opening 300 are for example measured in a plane parallel to the face 110. For example, in a light sensor where the pixels are arranged regularly with a pitch in the order of 3 μm, that is to say that each pixel has lateral dimensions in the order of 3 μm, the opening 300 of each pixel of the sensor has lateral dimensions less than or equal to 1 μm.

Figure 4:
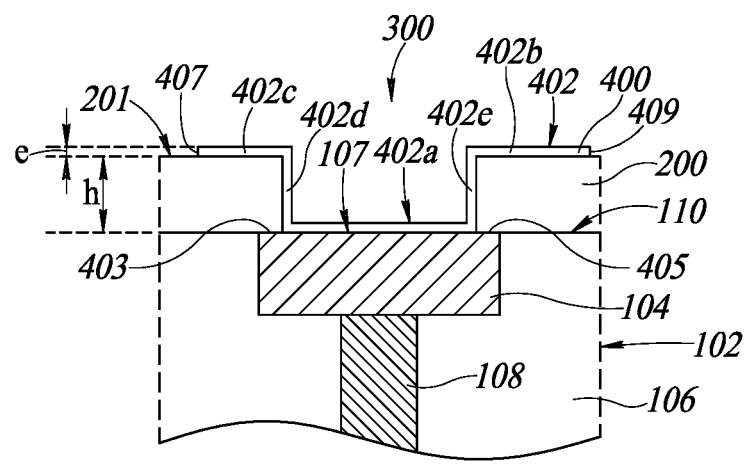
FIG. 4 illustrates, by schematic sectional view, still another step of the method for manufacturing the pixel.

In the step of FIG. 4, an electrode layer 400 is deposited or otherwise formed over the entire structure obtained at the end of the step described in relation with FIG. 3, and an electrode 402 is defined in the layer 400.

More particularly, the layer 400 is blanket-deposited, for example by chemical vapor deposition (CVD), or by atomic layer deposition (ALD), or by physical vapor deposition (PVD). In other words, the electrode layer is deposited on and in contact with the exposed part of the element 104 at the bottom of the opening 300 and on and in contact with the insulating layer 200, in particular on and in contact with the side walls 301, 303 of the opening 300. The thickness or dimension e of the electrode layer 400 is less than the thickness h of the layer 200, such that the layer 400 does not fill the opening 300.

As an example, the thickness e of the layer 400 is ten times smaller than that of the layer 200. As an example, the thickness e of the electrode layer 400 is inclusively between 5 and 100 nm.

According to one embodiment, the deposition of the layer 400 corresponds to the deposition of a single layer of an electrically conductive material, for example a metal or a metal alloy.

According to another embodiment, the deposition of the layer 400 corresponds to successive deposits of layers each made from an electrically conductive material, for example a metal or a metal alloy, optionally different between these successively deposited layers.

As an example, the electrode layer 400 comprises a layer of tantalum and/or a layer of titanium nitride and/or a layer of tantalum nitride.

In this embodiment, the electrode 402 is defined in the layer 400 by removing, by etching, portions of the layer 400 resting on the layer 200, that is to say portions of the layer 400 resting on the upper face 201 of the layer 200, the upper face of the layer 200 being parallel to the face 110 of the interconnect structure 102 and being opposite the face of the layer 200 resting on and in contact with the face 110.

Thus, the electrode 402 is formed by a portion of the layer 400 left in place. The electrode 402 completely covers the surface 107 of the exposed conductive element 104 at the bottom of the opening 300, that is to say the surface of the conductive element 104 that is not covered with the layer 200. The electrode 402 also completely covers the side walls 301, 303 of the opening 300. Lastly, the electrode 402 overflows or overlaps on the layer 200 around the opening 300. In other words, the electrode 402 comprises an annular portion extending laterally from the opening 300, and resting on and in contact with the layer 200.

In one embodiment, the conductive element 104 includes a first portion 403 and a second portion 405 that are covered by the layer 200. The electrode 402 includes a first end 407 and a second end 409. The first end is further from the sidewall 303 than an end or edge of the first portion 403. The second end is further from the sidewall 301 than an end of the second portion 405.

The electrode 402 includes a first portion 402a that is along the conductive element or otherwise adjacent to the conductive element. A second portion 402b is substantially parallel to the first portion and is on the surface 201 of the layer 200. A third portion 402c is substantially parallel to the first portion and is on the surface 201 of the layer 200, opposite to the second portion. There is a fourth portion 402d and a fifth portion 402e that are transverse to the first, second, and third portions.

Figure 5:
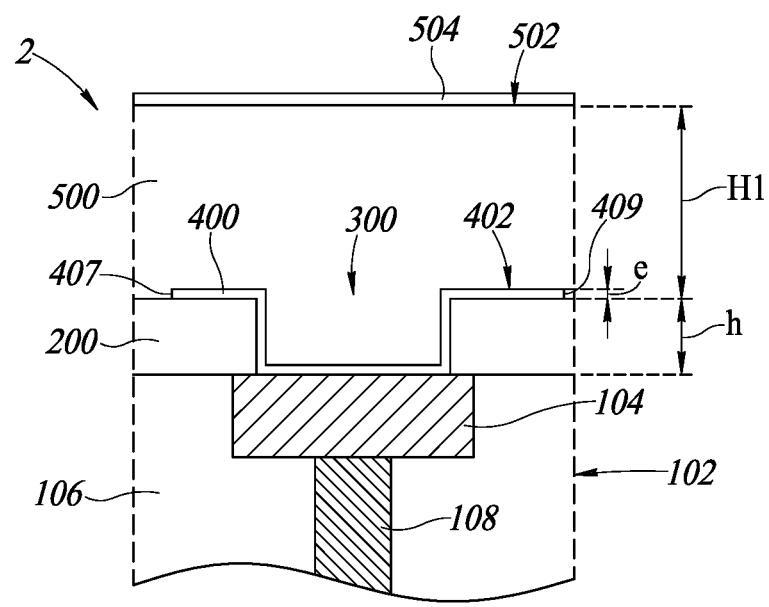
FIG. 5 illustrates, by schematic sectional view, still another step of the method for manufacturing the pixel.

In the step of FIG. 5, a photosensitive film 500 is deposited on the structure obtained at the end of the implementation of the steps described in relation with FIG. 4.

The photosensitive film 500 is blanket-deposited, so as to cover the electrode 402, and the exposed parts of the upper face of the layer 200.

The deposition method of the film 500 leads to obtaining a film 500 having a planar upper face, or exposed face, 502.

The film 500 is deposited such that its thickness or dimension H1, measured between the upper face of the layer 200 and the upper face 502 of the film 500, is less than or equal to a maximum thickness beyond which the delamination and/or cracking may occur in the film 500. This maximum thickness can be determined by the person skilled in the art, for example through routine tests, and in particular depends on the material of the film 500 and/or the implemented deposition method of the film 500.

Furthermore, the thickness H1 of the film 500 is greater than the thickness h of the layer 200, such that the film 500 completely fills the opening 300. Preferably, the thickness H1 of the film 500 is greater than at least 2 times the thickness h of the layer 200. As an example, the thickness H1 of the film 500 is inclusively between 200 nm and 1 μm, for example equal to about 500 nm.

Depending on the material of the film 500, the blanket deposition of the film 500 can be performed, for example, by liquid deposition, cathode sputtering deposition, evaporation deposition, spin coating, a spray coating, heliography, slot-dye coating, blade-coating, flexography or serigraphy. One example of spray coating is described in the article by Kramer et al., titled "Efficient Spray-Coated Colloidal Quantum Dot Solar Cells," Adv. Mater., 27:116-121.

Depending on the targeted thickness H1 and/or the shape in which the material of the film 500 is deposited, for example whether the material is deposited in the form of an ink or a colloidal solution stabilized by intermediate ligands, the deposition of the film 500 is carried out by a single deposition step, or by several successive depositions steps, each deposition step being able to be followed by a chemical treatment step and/or an annealing or drying step.

As an example, the material of the film 500 is deposited in the form of an ink, for example through several successive steps for deposition of the material of the film 500.

Each step for deposition of the material of the film 500 in the form of ink leads to obtaining a layer of the material of the film 500 having a thickness for example inclusively between about ten nanometers and one or several hundred nanometers, the thickness for example depending on the concentration of the deposited ink.

Each step for depositing the material of the film 500 in ink form is for example implemented at a temperature inclusively between 0° C. and 50° C., preferably between 10° C. and 25° C.

As an example, no chemical treatment is carried out after each step for depositing the material of the film 500 in ink form.

As an example, each step for depositing the material of the film 500 in ink form is followed by an annealing, for example at a temperature between 40° C. and 150° C., for example at a temperature of 100° C. This annealing for example lasts between one or several tens of seconds and one or several hours. This annealing is for example carried out on a hot plate or in a furnace. This annealing is for example carried out under ambient atmosphere, under controlled atmosphere, or under vacuum.

As an example, the material of the film 500 is deposited in the form of a colloidal solution stabilized by intermediate ligands, for example by several successive steps for deposition of this stabilized colloidal solution.

Each step for depositing a layer of colloidal solution stabilized by intermediate ligands is for example implemented at a temperature inclusively between 0 and 50° C., for example at a temperature of 15, 25 or 30° C.

Each step for depositing the material of the film 500 in the form of a colloidal solution stabilized by intermediate ligands is for example followed by one or several steps for chemical treatments in order to modify the properties of the deposited film of solution, for example to modify the properties of conductivity of the film for the electrons and/or the holes. For example, each deposited layer of colloidal solution stabilized by intermediate ligands is placed in contact with chemical solutions that interact with the deposited layer, so as to cause solid phase exchanges of the intermediate ligands present around nanocrystals forming quantum dots, by molecules making it possible to improve properties of the film 500. These molecules are for example chains of ligands shorter than those of the intermediate ligands, which makes it possible to increase the conductivity of the film 500, and/or of inorganic molecules, which makes it possible to increase the strength and/or the stability of the film 500 relative to its environment (air, light). These solid-phase chemical exchanges are for example carried out by several successive steps of contact between a chemical solution and the deposited layer of colloidal solution, each chemical solution for example being a solution comprising ligands or inorganic molecules intended to be exchanged with intermediate ligands of the deposited layer of colloidal solution.

As an example, each chemical solution is placed in contact with the deposited layer of colloidal solution for a duration inclusively between one and ten seconds and one and ten minutes, for example for a duration of 90 s.

As an example, rinsing steps can be provided between two successive contacts of a chemical solution with the deposited layer.

As an example, one or several intermediate annealing steps (between two successive contacts of a solution with the deposited layer) and/or a final annealing step can be provided. The temperatures of the annealing steps are for example inclusively between 40° C. and 150° C. The duration of each annealing step is for example inclusively between about 10 s and one or several hours. Each annealing step is for example carried out on a hot plate, for example, under ambient atmosphere, under controlled atmosphere or under vacuum, or in a furnace, for example under controlled atmosphere.

The effectiveness of the solid-phase chemical exchanges limits the maximum thickness of each deposited layer of stabilized colloidal solution, this maximum thickness being determined so that the entire volume of the deposited layer of stabilized colloidal solution is subject to solid-phase chemical exchanges with the chemical elements of interest of the chemical solutions placed in contact with this layer. As an example, the thickness of each deposited layer of stabilized colloidal solution is inclusively between several nanometers, for example from 3 to 5 nm, and several hundreds of nanometers, for example from 300 to 500 nm. As an example, the thickness of each deposited layer of stabilized colloidal solution is equal to about 50 nm.

According to one embodiment, the film 500 is a colloidal quantum dot film, or in other words, the film 500 comprises colloidal quantum dots.

From the structure shown in FIG. 5, a pixel 2 is obtained by implementing steps that are not illustrated.

In particular, one or several optional passivation layers (not shown in FIG. 5) and/or one or several insulating layers (not shown in FIG. 5) can be deposited on the exposed face 502 of the film 500, preferably on the entire face 502, preferably in contact with the face 502.

Furthermore, an electrode 504 is formed on the film 500. This electrode 504, called upper electrode of the pixel 2, is formed by depositing one or several conductive layers in which the upper electrode 504 is defined, for example by etching. Each component conductive layer of the upper electrode 504 is partially transparent to the operating wavelength(s) of the pixel 2. As an example, the upper electrode is made from indium tin oxide (ITO).

Furthermore, conventionally, one or several passivation layers (not shown in FIG. 5) and/or one or several insulating layers (not shown in FIG. 5) and/or one or several color filters (not shown in FIG. 5) and/or one or several lenses or microlenses (not shown in FIG. 5) can next be formed above the film 500 and the upper electrode of the pixel 2.

As shown in FIG. 5, in the pixel 2, above the portion of the electrode 402 that rests on the conductive element 104, the total thickness of the film 500 is equal to H1+h−e. Thus, if the thickness H1 of the film 500 is equal to the thickness H of the film 114 of the pixel 1 described in relation to FIG. 1, the film 500 of the pixel 2 is locally thicker than the film 114, while retaining a planar upper face 502. This overthickness of the film 500, localized above the electrode 402, leads to an increase in the quantum efficiency of the pixel 2 relative to the pixel 1.

According to one embodiment, the dimensions of the conductive element 104 of the pixel 2 that is flush with the face 110 are chosen as a function of the lateral dimensions of the opening 300 etched in the step of FIG. 3. For example, these dimensions are chosen such that, in the step illustrated in relation with FIG. 3, by adapting the location of the opening 300 relative to the location of the conductive element 104, the opening 300 emerges only on this electrically conductive element 104.

The first end 407 and the second end 409 of the electrode 402 are covered by the film 500.

However, in a variant, when the conductive element 104 flush with the face 110 has lateral dimensions, for example measured in a plane parallel to the face 110, smaller than those of the opening 300, the opening 300 then emerges partially on the conductive element 104 and partially on the layer 106 of the interconnect structure. In this variant, the electrode 402 formed in the step of FIG. 4 completely covers the conductive element 104 and the exposed layer portions 106 at the bottom of the opening 300.

Furthermore, according to one embodiment, in the step of FIG. 3, the opening 300 is etched in a central part of the pixel 2 seen from above. Thus, when the electromagnetic rays received by the pixel 2 are focused in a central part of the film 500 seen from above, for example by one or several lenses or microlenses, these rays are focused in a portion of the film 500 having a total thickness equal to H1+h−e.

According to one embodiment, the thickness h of the layer 200 is equal or substantially equal to half of the wavelength, in the film 500, of an incident ray of the pixel 2. Thus, when the pixel 2 receives electromagnetic rays at this wavelength, this makes it possible to obtain constructive interference between, on the one hand, an electromagnetic ray that has passed through the film 500 and that has been reflected on the portion of the electrode 402 arranged at the bottom of the opening 300 and, on the other hand, an electromagnetic ray that has passed through the film 500 and that has been reflected on a portion of the electrode 402 resting on the upper surface of the layer 200.

According to one embodiment, one or several operating wavelengths of the pixel 2 are inclusively within the near infrared and are for example inclusively between 750 nm and 3000 nm. For example, the pixel 2 has an operating wavelength equal to 940 nm. The person skilled in the art is able to adapt the thicknesses e, H1 and/or h, and/or the material(s) of the film 500 to the operating wavelength(s) of the pixel 2. For example, in the case where the film 500 comprises colloidal quantum dots, based on the operating wavelength(s) of the pixel 2, the person skilled in the art is able to adapt the dimensions and the composition in component nanocrystals of the colloidal quantum dots.

The inventors have noted that the quantum efficiency of a pixel 2 was up to 13% higher than the quantum efficiency of a corresponding pixel 1, that is to say, a pixel 1 whose film 114 is made from the same material as the film 500 of the pixel 2 and has a thickness H equal to the thickness H1 of the film 500 of the pixel 2, and whose lower 112 and upper 117 electrodes are made from the same materials and have the same thicknesses as the lower 402 and upper 504 electrodes of the pixel 2. For example, the inventors have measured a quantum efficiency in the order of 0.35 electrons per incident photon for a pixel 2, and in the order of 0.31 electrons per incident photon for a corresponding pixel 1.

Although embodiments and variants have been described above, in relation with FIGS. 2 to 5, of a method for manufacturing a single pixel 2, several identical pixels 2, for example of the same light sensor or several light sensors, can be manufactured simultaneously from a single layer or semiconductor wafer 100 (FIG. 1), by carrying out the described steps simultaneously for all of these pixels 2. The pixels 2 thus manufactured can then share a same film 500.

Various embodiments and modes of implementation have been described. Those skilled in the art will understand that certain features of these embodiments, modes of implementation and variants can be combined and other variants will readily occur to those skilled in the art. In particular, although a pixel 2 has been described in which the conductive element of the interconnect structure 102 that is in contact with the electrode 402 is a conductive layer portion 104, the person skilled in the art is able to adapt the described method to the case where this conductive element is a via 108.

Finally, the practical implementation of the embodiments, modes of implementation and variants described herein is within the capabilities of those skilled in the art based on the functional description provided hereinabove. In particular, the person skilled in the art is able to choose the material(s) of the film 500 based on the targeted application, and/or to determine, for a given film 500, the maximum value of the thickness H1 from which delamination and/or cracking may form in the film 500. Furthermore, the person skilled in the art is able to provide that one of the upper and lower electrodes of the pixel 2 or each of these electrodes comprises at least one layer of a material making it possible to adapt the output work of the considered electrode based on the charges (electrons or holes) collected by this electrode. Furthermore, the person skilled in the art is able to produce the photolithography masks making it possible to produce etching masks in order to carry out the etching steps previously described.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A pixel, comprising:
an interconnect structure having a first surface extending along a first direction, the interconnect structure includes a conductive element having a second surface coplanar with the first surface, the second surface extending along the first direction, the second surface having a first dimension along the second surface coplanar with the first surface, the first dimension being along the first direction;
an insulating layer on and in contact with the first surface, the insulating layer including a third surface spaced from the first and second surfaces in a second direction transverse to the first direction;
an opening through the insulating layer to the conductive element, the opening having a second dimension along the first direction that is smaller than the first dimension of the conductive element;
sidewalls of the insulating layer extending away from the conductive element along the second direction;
an electrode on and in contact with the second surface of the conductive element, on the sidewalls, and on the third surface of the insulating layer, wherein the electrode is ten times thinner, than the insulating layer, the electrode having a fourth surface opposing the second surface of the conductive element, the fourth surface being inside the opening and between the second surface and third surface along the second direction; and
a film on the electrode, in the opening, and on the third surface of the insulating layer, the film being configured to convert photons into electron-hole pairs when a ray at an operating wavelength of the pixel reaches the pixel.

2. The pixel according to claim 1, wherein the interconnect structure includes a semiconductor substrate, the electrode completely covers the conductive element in a bottom of the opening, and the film comprises colloidal quantum dots.

3. A device, comprising:
a substrate;
an interconnect structure on the substrate, the interconnect structure including:
a first insulating layer having a first surface that extends along a first direction; and
a conductive element having a second surface coplanar with the first surface of the first insulating layer, the second surface having a first dimension along the first direction;
a second insulating layer on the interconnect structure, the second insulating layer having a third surface extending in the first direction and being different from the first and the second surfaces, the third surface being separated from the second surface along a second direction transverse to the first direction;
an opening through the second insulating layer to the conductive element, the opening having a second dimension along the first direction smaller than the first dimension of the conductive element;
sidewalls of the second insulating layer extend away from the conductive element in the second direction;
a first electrode having a first portion on the third surface of the second insulating layer along the first direction, a second portion on the sidewalls along the second direction, and a third portion in directed contact with the conductive element in the opening in the first direction; and
a photosensitive film on the first electrode, in the opening, and on the third surface of the second insulating layer.

4. The device of claim 3 wherein the first electrode includes a third dimension in the first direction, the third dimension being greater than the first dimension.

5. The device of claim 4 wherein the first electrode includes a fourth dimension in the second direction, the opening includes a fifth dimension in the second direction, the fifth dimension being at least ten times greater than the fourth dimension, and the film includes a sixth dimension that is at least two times greater than the fifth dimension.

6. The device of claim 3, further comprising a second electrode on the film, the first electrode including a first end that overlaps the third surface of the second insulating layer and a second end that overlaps the third surface of the second insulating layer, the first and second ends being further from the sidewalls than ends of the conductive element.

7. The device of claim 3, wherein the substrate includes a semiconductor layer and a plurality of CMOS components are formed in and adjacent to the semiconductor layer, and the interconnect structure is electrically coupled to the CMOS components.

8. A device, comprising:
a pixel that includes:
- an insulating layer on an exposed surface of an interconnect structure of an integrated circuit, the exposed surface extending along a first direction, the insulating layer includes a diffusion barrier layer on and in contact with the exposed surface of the interconnect structure, the insulating layer having a first surface opposite a second surface along a second direction transverse to the first direction;
- a conductive element in the interconnect structure having a first surface flush with the exposed surface along the first direction, the second surface of the insulating layer being directly in contact with the first surface of the conductive element;
- an opening through the insulating layer to the conductive element, the opening extending from the first surface of the insulating layer to the second surface of the insulating layer, the opening having a first dimension in the first direction smaller than a second dimension of the first surface of the conductive element along the first direction;
- an electrode layer on and in contact with the conductive element and the insulating layer;
- a first electrode being on the conductive element, on side walls of the opening, and on a surface of the insulating layer; and
- a film on the first electrode and in the opening, the first electrode being in contact with the film in at least three faces, at least one of the at least three faces being in a first direction, and at least two of the at least three faces being in a second direction traverse from the first direction.

9. The device claim 8, wherein the film comprises colloidal quantum dots and the film is configured to convert photons into electron-hole pairs when a ray at an operating wavelength of the pixel reaches the pixel.

10. The device of claim 8, wherein a part of the conductive element exposed by the opening and the side walls of the opening are completely covered by the first electrode, the first electrode overflowing onto the insulating layer around the opening.

11. The device of claim 8, wherein a thickness of the insulating layer is substantially equal to half of an operating wavelength of the film.

12. The device of claim 9, wherein said wavelength of the ray is inclusively between 750 nm and 3000 nm.

13. The device of claim 8, wherein the film includes an exposed surface of the film that is planar.

14. The device of claim 8, wherein the electrode layer includes at least one layer of a conductive material.

15. The device of claim 8, wherein the electrode layer includes a layer from one from among tantalum, titanium nitride, and tantalum nitride.

16. The device of claim 15, further comprising a second electrode on the film.

17. The device of claim 16, wherein the second electrode includes one or more materials transparent to an operating wavelength of the film.

18. The device of claim 8, wherein the insulating layer includes at least one layer of an insulating material.

19. The device of claim 8, wherein the electrode layer is ten times thinner, than the insulating layer.

20. The device of claim 8, where the film is at least two times thicker than the insulating layer.

* * * * *